(12) United States Patent
Yang et al.

(10) Patent No.: US 7,867,893 B2
(45) Date of Patent: Jan. 11, 2011

(54) METHOD OF FORMING AN SOI SUBSTRATE CONTACT

(75) Inventors: Haining S. Yang, Wappingers Falls, NY (US); Ramachandra Divakaruni, Ossining, NY (US); Byeong Y. Kim, LaGrangeville, NY (US); Junedong Lee, Hopewell Junction, NY (US); Gaku Sudo, Yokohama (JP)

(73) Assignees: International Business Machines Corporation, Armonk, NY (US); Kabushiki Kaisha Toshiba, Tokyo (JP)

( * ) Notice: Subject to any disclaimer, the term of this patent is extended or adjusted under 35 U.S.C. 154(b) by 539 days.

(21) Appl. No.: 11/769,914

(22) Filed: Jun. 28, 2007

(65) Prior Publication Data
US 2009/0001466 A1 Jan. 1, 2009

(51) Int. Cl.
*H01L 27/01* (2006.01)
(52) U.S. Cl. ............... 438/638; 438/424; 257/E21.564
(58) Field of Classification Search ............. 438/637, 438/638, 404, 424; 257/E21.538, E21.495, 257/E21.564
See application file for complete search history.

(56) References Cited

U.S. PATENT DOCUMENTS

| | | | | |
|---|---|---|---|---|
| 6,645,796 | B2* | 11/2003 | Christensen et al. | 438/149 |
| 2003/0203546 | A1* | 10/2003 | Burbach et al. | 438/151 |
| 2004/0121599 | A1* | 6/2004 | Aminpur et al. | 438/689 |
| 2008/0164531 | A1* | 7/2008 | Jawarani et al. | 257/369 |

* cited by examiner

*Primary Examiner*—Thomas L Dickey
*Assistant Examiner*—Fazli Erdem
(74) *Attorney, Agent, or Firm*—Yuanmin Cai

(57) ABSTRACT

A method is provided of forming a conductive via for contacting a bulk semiconductor region of a semiconductor-on-insulator ("SOI") substrate. A first opening is formed in a conformal layer overlying a trench isolation region, where the trench isolation region shares an edge with the SOI layer. A dielectric layer then is deposited atop the conformal layer and the trench isolation region, after which a second opening is formed which is aligned with the first opening, the second opening extending through the dielectric layer to expose the bulk semiconductor region. Finally, the conductive via is formed in the second opening.

15 Claims, 12 Drawing Sheets

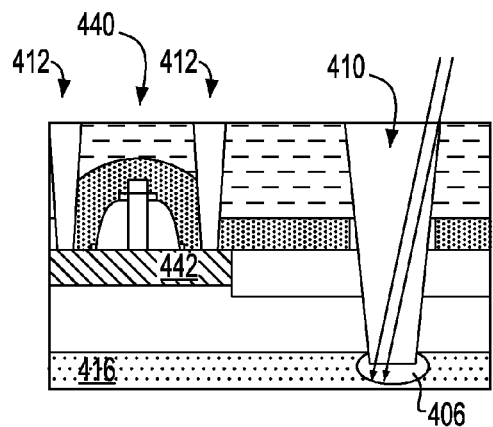
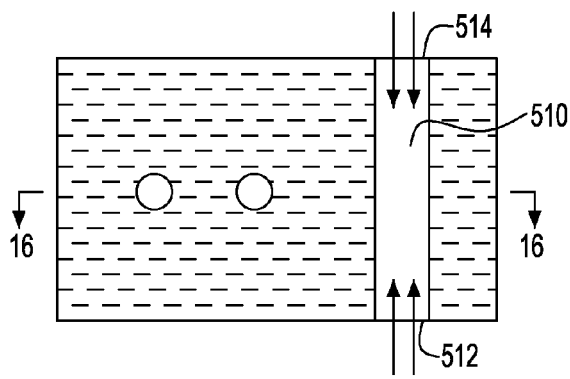
FIG. 16　　FIG. 17
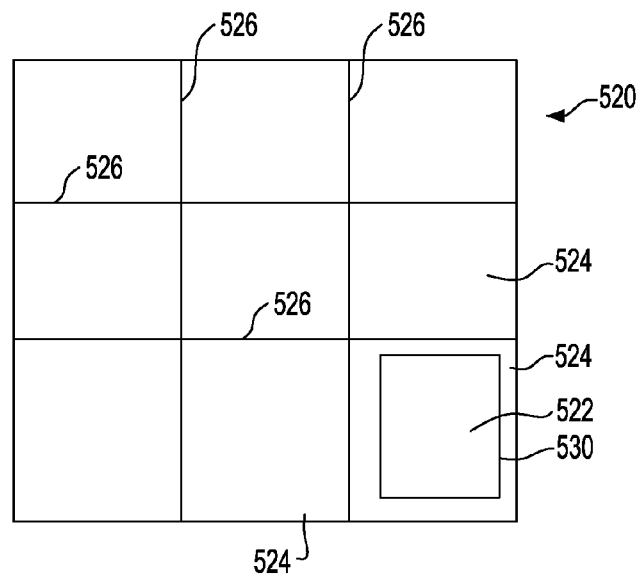
FIG. 18

METHOD OF FORMING AN SOI SUBSTRATE CONTACT

BACKGROUND OF THE INVENTION

The present invention relates to microelectronic devices and their fabrication.

In ordinary semiconductor substrates, the active semiconductor region of a transistor is disposed in a well region of an oppositely doped bulk semiconductor region. In such structure, junction capacitance between the well and the bulk semiconductor region can impact performance. For increased performance, some microelectronic devices have active semiconductor regions in a silicon-on-insulator ("SOI") layer of an SOI substrate. The SOI layer is separated from the main or "bulk" semiconductor region of the substrate by an insulating layer such as a buried oxide ("BOX") layer or other dielectric layer. The insulating layer improves performance by eliminating junction capacitance between the SOI layer and the bulk semiconductor region.

However, SOI substrates are more complex than ordinary semiconductor substrates. More complex processing is required to form devices and to assure that they remain functional during use. In particular, SOI substrates require conductive vias to pass through the BOX layer and contact the bulk semiconductor region. In this way, the SOI substrate serves as a common node or ground node for devices. FIG. 1 illustrates a prior art contact structure in which a conductive via 10 extends through a stressed silicon nitride layer 12 and is electrically connected with a bulk semiconductor region 16 of an SOI substrate 20 through a polysilicon plug 14 covered with a silicide layer 44. As further shown in FIG. 1, another conductive via 50 is electrically connected to a semiconductor device, e.g., a field effect transistor 40 through a silicide layer 45 of its gate conductor. Both conductive vias extend through an interlevel dielectric layer 46 disposed above the device 40.

One drawback of the prior art contact structure is a number of processing steps which are needed only for the purpose of making the contact structure. To form the contact structure, an SOI substrate 20 (FIG. 2) having a trench isolation region 24 disposed therein and a nitride layer 22 thereon, is covered with a photoimageable layer 26, e.g., photoresist layer, which is then patterned to form an opening 28 within the boundaries of the trench isolation region 24 as shown in FIG. 2. As shown in FIG. 3, an opening 30 in the trench isolation region 24 and a BOX layer 18 of the substrate is patterned in accordance with the photoresist layer 26, such that the bulk semiconductor region 16 becomes exposed within the opening. As shown in FIG. 4, the photoresist is removed and then the opening in the trench isolation region 24 and the BOX layer 18 is filled with a layer of polysilicon 32 in contact with the bulk semiconductor region 16. The polysilicon fill 32 then is reduced in height and planarized to a major surface 34 of the trench isolation region 24 and the pad nitride layer 22 (FIG. 5). As illustrated in FIG. 6, the pad nitride layer then is removed and a device such as a field effect transistor 40 is formed which has a channel region 41 disposed within an active semiconductor region 42 of the substrate. Referring again to FIG. 1, regions 44, 45 of silicide then are formed atop the polysilicon plug 14 and atop a gate conductor of the FET 40, after which the interlevel dielectric layer 46 is formed. Conductive vias 10 and 50 then are formed which extend through the interlevel dielectric layer 46 and the stressed nitride layer 12 to contact the silicide layers 44, 45.

In such prior art method, the sole purpose of the processing described with respect to FIGS. 3, 4 and 5 is to form the polysilicon plug 14 that makes up part of the conductive structure contacting the bulk substrate region 16. It would be desirable to reduce the amount of processing required to form the conductive contact structure.

SUMMARY OF THE INVENTION

A method is provided of forming a conductive via for contacting a bulk semiconductor region of a semiconductor-on-insulator ("SOI") substrate. A first opening is formed in a conformal layer overlying a trench isolation region, the trench isolation region sharing an edge with the SOI layer. A dielectric layer then is deposited atop the conformal layer and the trench isolation region. A second opening can be formed which is aligned with the first opening, the second opening extending through the dielectric layer to expose the bulk semiconductor region. A conductive via can then be formed in the second opening.

BRIEF DESCRIPTION OF THE DRAWINGS

FIGS. 16 and 17 are sectional views illustrating stages in a method of fabricating a microelectronic structure in accordance with another variation of the embodiment illustrated in FIGS. 7 through 13.

FIG. 18 is a plan view illustrating a stage in a method of fabricating a microelectronic structure in accordance with one or more of the embodiments of the invention.

DETAILED DESCRIPTION

Figure 1:
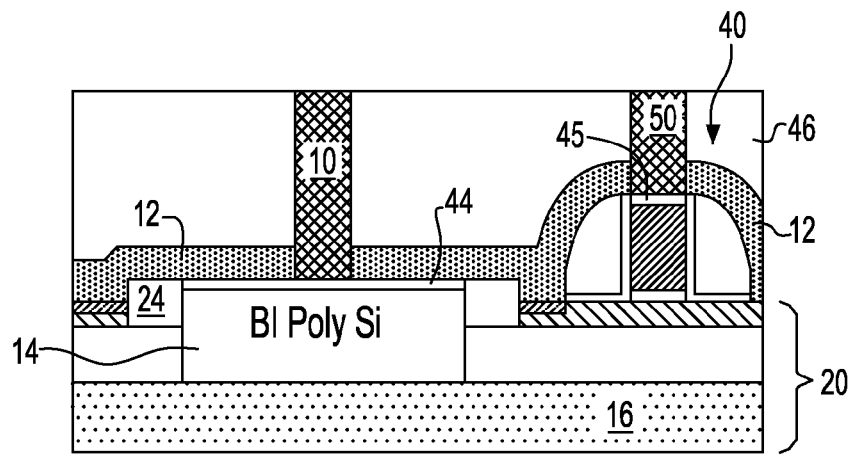
FIG. 1 is a sectional view illustrating a microelectronic structure including a substrate contact via according to the prior art.
Figure 2:
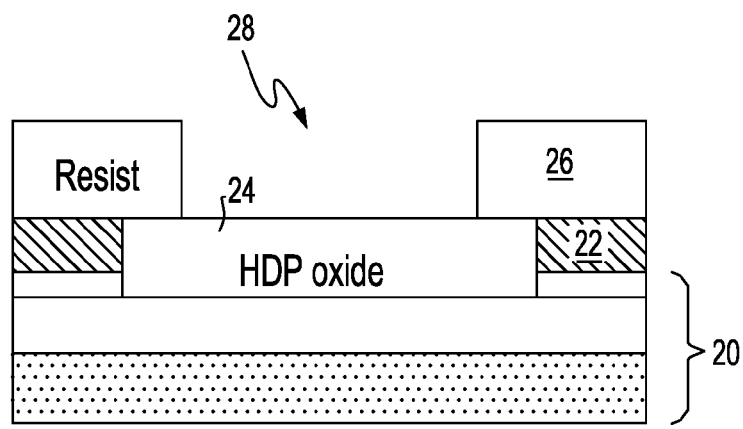
FIGS. 2 through 6 are sectional views illustrating a method of fabricating the microelectronic structure shown in FIG. 1 in accordance with an embodiment of the invention.
Figure 3:
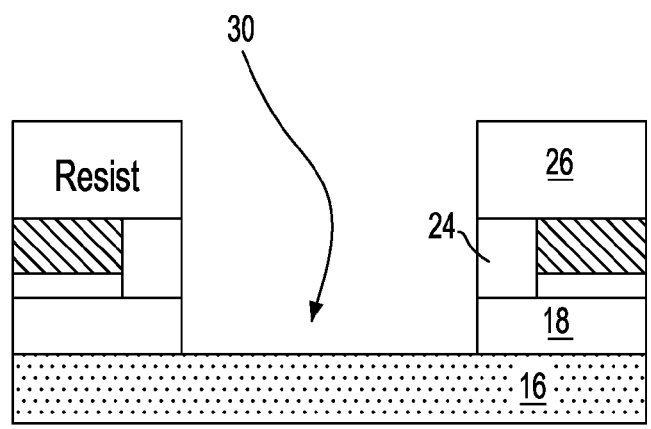
Figure 4:
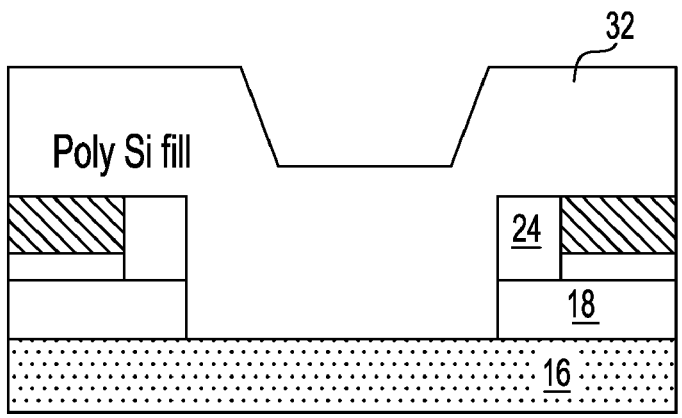
Figure 5:
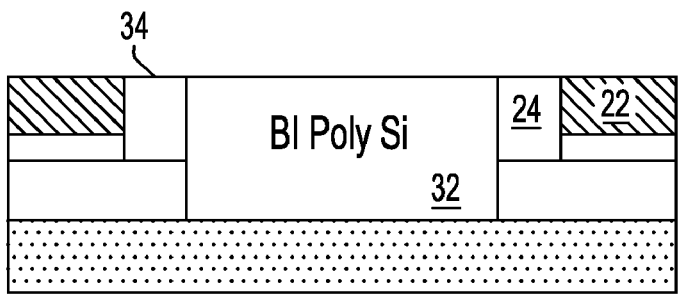
Figure 6:
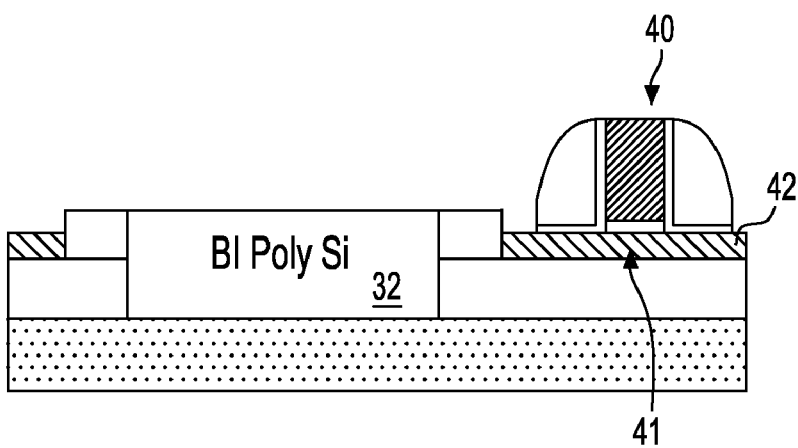
Figure 7:
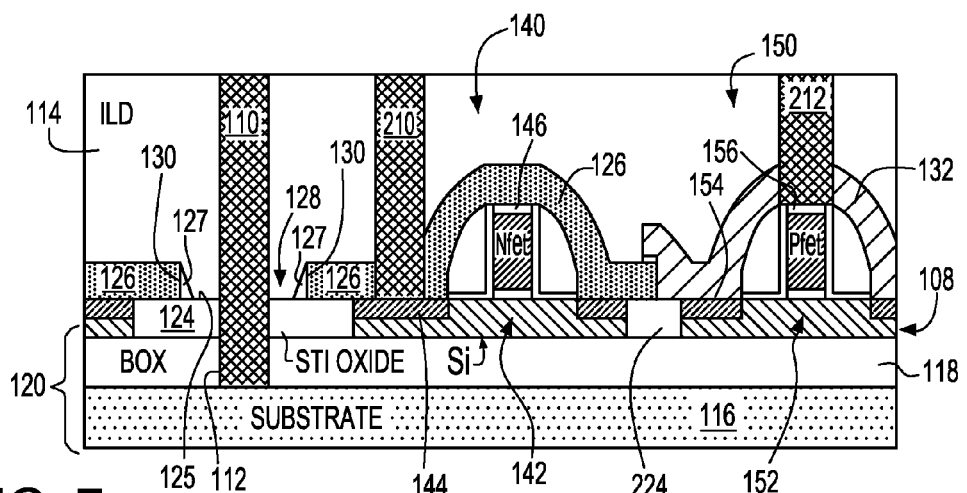
FIG. 7 is a sectional view illustrating a microelectronic structure including a substrate contact via in accordance with an embodiment of the invention.

FIG. 7 is a sectional view illustrating a microelectronic structure having a substrate contact via 110 in accordance with an embodiment of the invention. The contact via 110 contacts a bulk semiconductor region 116 of an SOI substrate 120. For example, the SOI substrate may be a silicon-on-insulator structure having a layer 108 of monocrystalline silicon separated from a bulk silicon region 116 by a buried oxide ("BOX") layer 118. The layer 108 may consist essentially of silicon, or may include an alloy of silicon, e.g., silicon germanium, silicon carbon, or may include a portion consisting essentially of silicon and a portion consisting essentially of an alloy of silicon. The layer 108 may consist essentially of one or more semiconductor compounds including Group III and Group IV elements, e.g., compounds such as GaAs, InP, etc or the layer 108 may consist essentially of one or more semiconductor compounds of Group II and Group VI elements.

In order from top to bottom, the substrate contact via extends through an interlevel dielectric ("ILD") layer 114, a trench isolation region 124 and a BOX layer 118 of the SOI substrate. As further shown in FIG. 7, at least a first conformal layer 126 overlies a first microelectronic device such as an n-type field effect transistor ("NFET") 140. Typically, the conformal layer 126 includes an internally stressed dielectric material. For example, the conformal layer 126 can include silicon nitride having an internal stress. The magnitude of the internal stress usually is greater than 0.5 gigapascals ("GPa"). The conformal layer 126 can have an internal stress which is tensile or compressive. Desirably, the conformal layer 126 has tensile stress having a magnitude greater than about 1.0 GPa in order to apply a beneficial tensile stress to a channel region of the NFET.

An opening 128 in the conformal layer 126 exposes a major surface 125 of the trench isolation region 124. The substrate contact via 110 extends through the opening 128. Spacers 127 may be disposed along walls 130 of the first conformal layer 126. Typically, the spacers 127 are formed by a process which patterns a second conformal layer 132 overlying another microelectronic device, e.g., a p-type field effect transistor ("PFET") 150. Desirably, the conformal layer 132 also includes internally stressed silicon nitride. The conformal layer 132 desirably has compressive stress having a magnitude greater than about 1.0 GPa in order to apply a beneficial compressive stress to a channel region of the PFET.

The NFET 140 and the PFET 150 have active semiconductor regions 142 and 152, respectively, disposed in the SOI layer 108 of the substrate 120. The active semiconductor regions are separated by a second trench isolation region 224. As further shown in FIG. 7, an NFET contact via 210 extends through the first conformal layer 126 to contact a silicide layer 144 in conductive communication with the active semiconductor region 142 of the NFET. A PFET contact via 212 extends through the second conformal layer 132 to contact a silicide layer 156 of a gate conductor of the PFET 150. Typically, other conductive vias (not shown) are also present which extend through the ILD layer 114 and the first and second conformal layers 126, 132 to contact a silicide layer 146 of the gate conductor of the NFET and to contact the silicide layer 154 overlying the active semiconductor region of the PFET, respectively.

Figure 8:
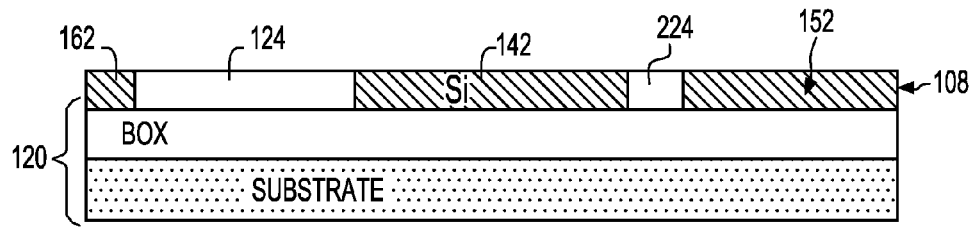
FIGS. 8 through 13 are sectional views illustrating a method of fabricating the microelectronic structure of FIG. 7 in accordance with an embodiment of the invention.

A method of fabricating the microelectronic structure shown in FIG. 7 will now be described. In a preliminary stage of fabrication shown in FIG. 8, a trench isolation region 224 separates active semiconductor regions 142, 152 of an SOI layer 108 of the substrate 120 from each other. Trench isolation region 124 separates active semiconductor region 142 from another semiconductor region 162 of the SOI layer.

Figure 9:
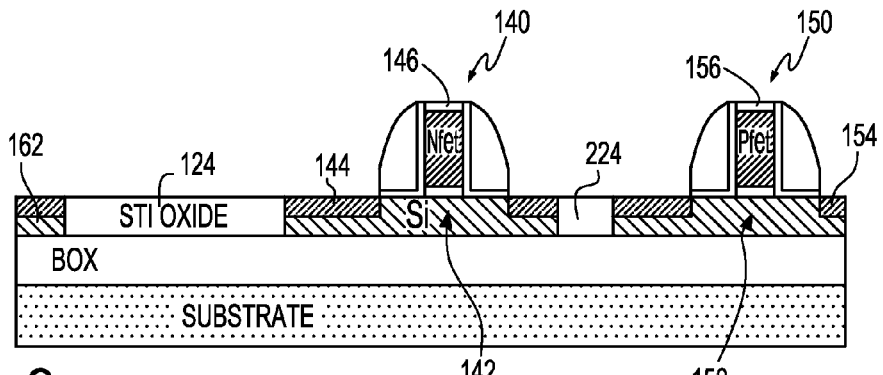

As shown in FIG. 9, devices are then formed in the respective active semiconductor regions. For example, an NFET 140 can be formed which has a channel region in active semiconductor region 142 and a PFET 150 can be formed which has a channel region in active semiconductor region 152. Silicide regions 144, 146, 154 and 156 contact the active semiconductor regions or portions of the gate conductors of each transistor.

Figure 10:
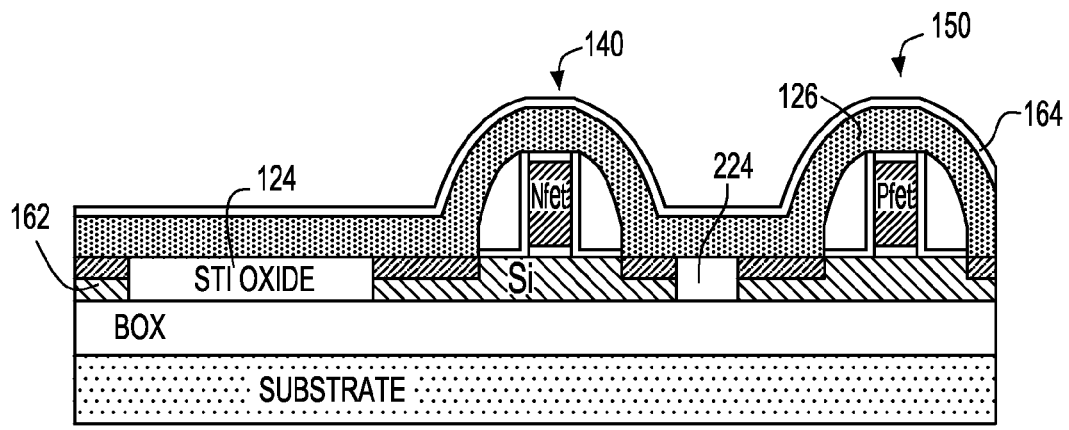
Figure 11:
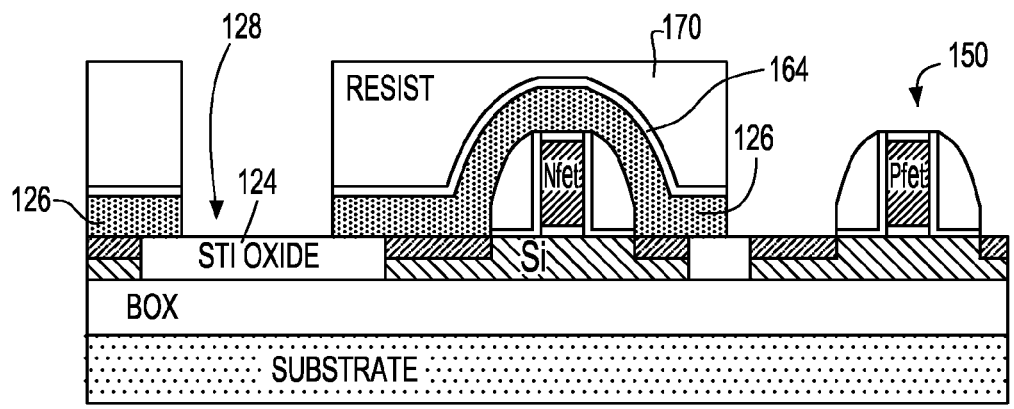

Next, as illustrated in FIG. 10, a first conformal layer 126, e.g., a tensile stressed silicon nitride layer, is deposited to overlie the PFET 150 and the NFET 140, the trench isolation regions 124, 224 and semiconductor region 162. A hard mask layer 164 such as a layer of silicon dioxide then is deposited to cover the first conformal layer 126. As shown in FIG. 11, a photoresist layer 170 then is deposited and photolithographically patterned to form openings overlying the PFET 150 and the trench isolation region 124. Portions of the oxide hard mask layer 164 and the first conformal layer 126 overlying the PFET and the trench isolation region 124 are then removed. In such way, the PFET 150 is uncovered and an opening 128 is formed above the trench isolation region 124.

Figure 12:
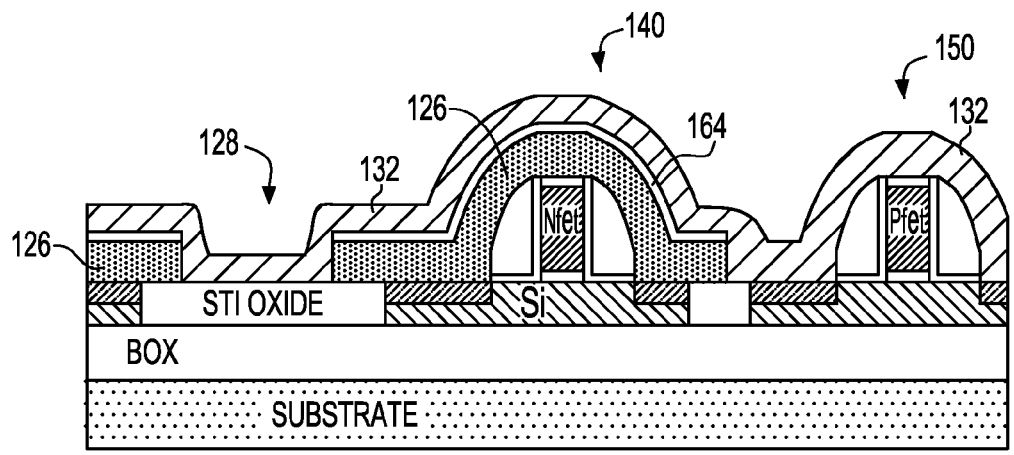
Figure 13:
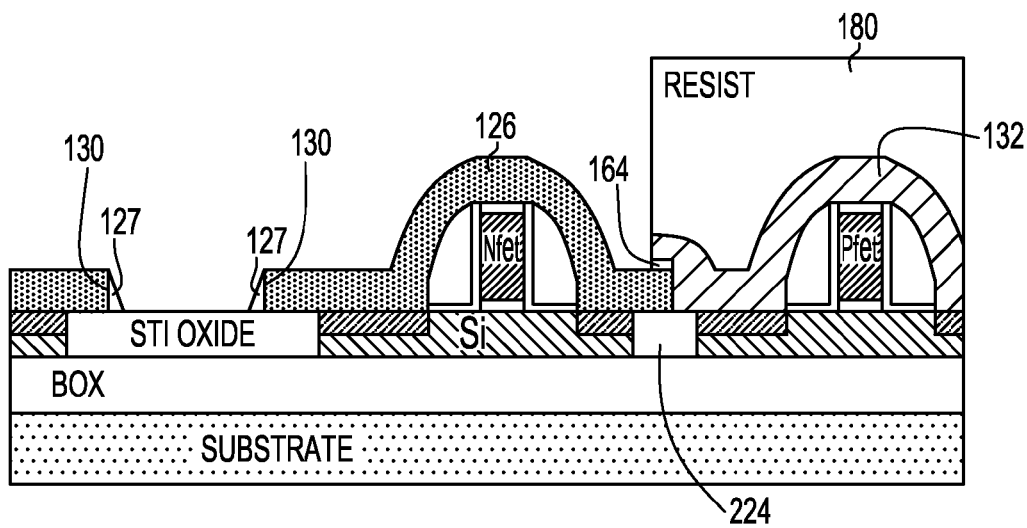

Thereafter, as shown in FIG. 12, the photoresist layer is removed and a second conformal layer 132 is deposited to overlie the structure including the oxide hard mask layer 164, the first conformal layer 126, the PFET 150, the NFET 140 and within the opening 128. Then, as illustrated in FIG. 13, a further photoresist layer 180 is deposited and patterned, after which exposed portions of the second conformal layer 132 are selectively removed. For example, an etching process which selectively attacks silicon nitride can be used to remove the second conformal silicon nitride layer 132 in relation to the oxide hard mask layer 164. This process results in the formation of spacers 127 from the second conformal layer, the spacers 127 disposed along walls 130 of the first conformal layer 126.

Thereafter, the oxide layer 164 can be removed, such that a portion of the oxide layer 164 remains only over a portion of the first conformal nitride layer 126 above the trench isolation region 224. Here, as shown in FIG. 13, the oxide layer 164 may be sandwiched between the first conformal layer 126 and the overlapping second conformal layer 132.

Referring again to FIG. 7, to complete the structure, the ILD layer 114 is deposited over the structure and contact holes are then patterned in the ILD layer in locations corresponding to conductive vias 110, 210 and 212. The ILD layer 114 typically includes or consists essentially of an oxide of silicon, which may or may not be doped, e.g., such as a doped silicate glass. Desirably, a unitary etch process is used to simultaneously form all of the contact holes for all of the conductive vias shown in FIG. 7. During the unitary etch process, the contact hole corresponding to via 110 forms an opening extending through the ILD layer, the trench isolation region 124 and the BOX layer, all of which may consist essentially of silicon oxide. During the unitary etch process, conditions are controlled in preference for the requirements of forming the contact holes needed for the vias 210, 212. For example, the etch process conditions and the amount of time provided for the etching process is controlled to provide a sufficient amount of time to form all contact holes extending through the first and second conformal layers 126, 132, wherever they appear on a wafer. The etch process conditions will then be sufficient to form the contact hole corresponding to via 110.

A semiconductor, a metal, a conductive compound of a metal, or a combination of such materials then is deposited to fill the contact holes, thus forming the conductive vias 110, 210, and 212 shown in FIG. 7. The semiconductor may include a polycrystalline semiconductor such as polysilicon or other polycrystalline semiconductor or amorphous semiconductor material. The conductive metal compound may include, for example, a silicide, conductive metal nitride, etc., or a combination thereof.

Figure 14:
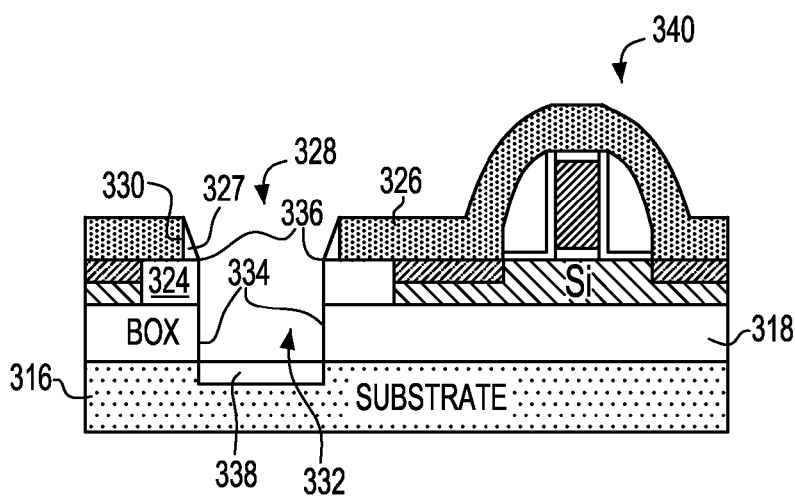
FIGS. 14 and 15 are sectional views illustrating stages in a method of fabricating a microelectronic structure in accordance with a variation of the embodiment illustrated in FIGS. 7 through 13.

FIG. 14 illustrates a variation of the above-described embodiment. Here, for ease of description, only a first microelectronic device 340 is shown, e.g., an NFET. In the variation shown in FIG. 14, the contact hole for forming the conductive via is not etched directly through the trench isolation region 324 and the BOX layer 318. Instead, an opening 328 in the first conformal layer 326 is extended downward through the trench isolation region 324 and the BOX layer 318 to partially expose a surface of the bulk semiconductor region 316. Typically, the opening 328 is extended by etching the oxide trench isolation region and oxide BOX layer selectively using an anisotropic etch process such as a reactive ion etch ("RIE"). In this way, an opening 332 is formed in the trench isolation region and the BOX layer, the opening having walls 334 aligned with the exposed edges 336 of spacers 327.

Figure 15:
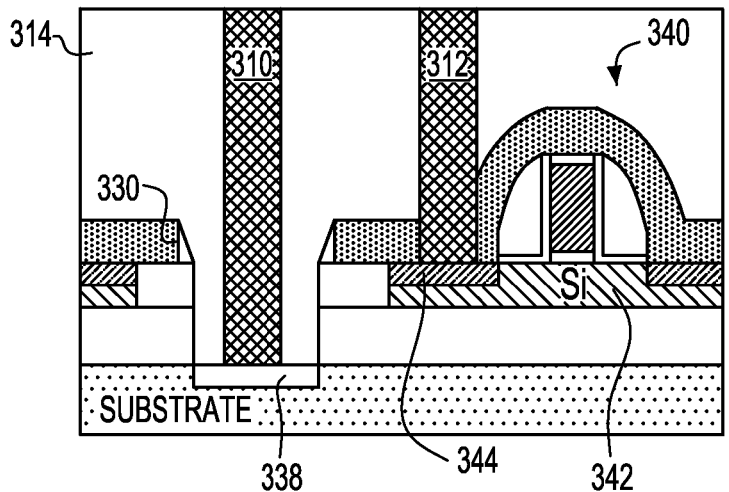

After forming the opening 332, a low-resistance layer 338 (FIG. 15), which may include a metal or conductive compound of a metal, e.g., a silicide, or both, is formed within the opening 332 atop the exposed surface of the bulk silicon region 316. An ILD layer 314 is formed, after which a contact hole is formed extending through the ILD layer 314 to contact the low-resistance layer 338. A second contact hole also is formed to contact a low-resistance layer 344, e.g., silicide layer, joined to the active semiconductor region 342 of device 340. A conductive material, e.g., a doped semiconductor material, metal, conductive metal compound, or combination of semiconductor, metal or metal compound is deposited to fill the contact holes, thus forming conductive vias 310, 312 which are conductively connected to the low-resistance layers 338 and 344, respectively.

FIGS. 16 and 17 illustrate another variation of the embodiment shown and described above with reference to FIGS. 7 through 13. In the embodiment illustrated in FIGS. 16-17, the substrate contact hole 410 is wider, i.e., has a lower height-to-width aspect ratio than contact holes 412 which expose portions of the microelectronic device. As a result, an angled ion implant process can be used to implant an exposed portion 406 of the bulk semiconductor region 416 aligned with the hole 410. The ion implant process is performed in order to increase a concentration of a dopant in region 406 to decrease contact resistance to the conductive via when completed. The ion implant process typically involves implanting boron into region 406 to raise a concentration of boron therein to greater than about $1.0 \times 10^{17}$ cm$^{-3}$, and desirably to a concentration greater than about $1.0 \times 10^{19}$ cm$^{-3}$. During this angled ion implant process, the greater height-to-width aspect ratio of the contact holes 412 avoids the active semiconductor region 442 of the microelectronic device from being implanted through the contact holes 412. After completing the ion implant process, the contact holes 410 and 412 are filled in a manner as described above to form conductive vias contacting the substrate and the active semiconductor region of device 440, respectively.

The top plan view provided in FIG. 17 illustrates a particular variation of the invention in that the conductive contact to the substrate is provided in form of a conductive linearly extending trench 510. Typically, the trench 510 extends beyond edges 512, 514 of the view shown in FIG. 17. FIG. 18 illustrates a substrate, e.g., a wafer or portion of a wafer which includes a plurality of individual regions 524. Each region 524 typically includes a microelectronic chip or a portion of a chip. Lines 526 indicate boundaries of the regions. In one example, the lines 526 indicate locations of dicing lanes at which the regions 524 will be separated into individual chips.

The conductive trench shown in FIG. 17 may be provided in form of a conductive guard ring 530 which circumscribes, encloses, or at least substantially encloses an area 522 of the substrate 520, e.g., an area of an individual chip or an area smaller than the area of an individual chip.

Figure 19:
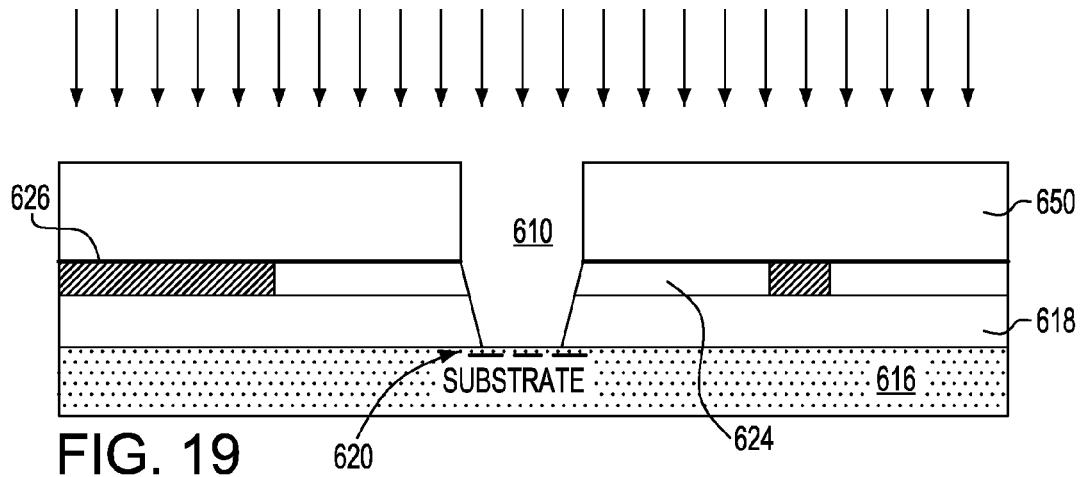
FIGS. 19 through 21 are sectional views illustrating stages in a method of fabricating a microelectronic structure in accordance with an embodiment of the invention.
Figure 20:
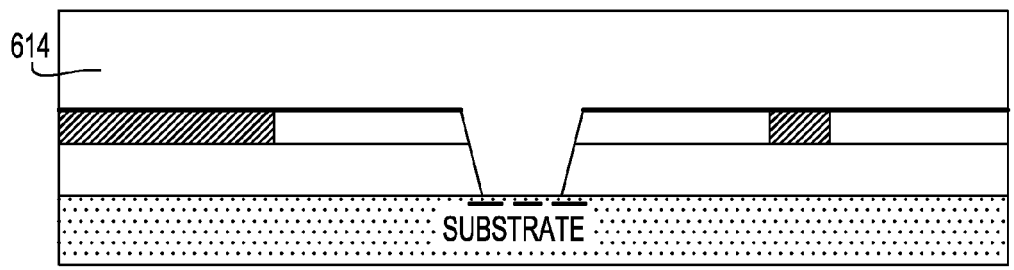
Figure 21:
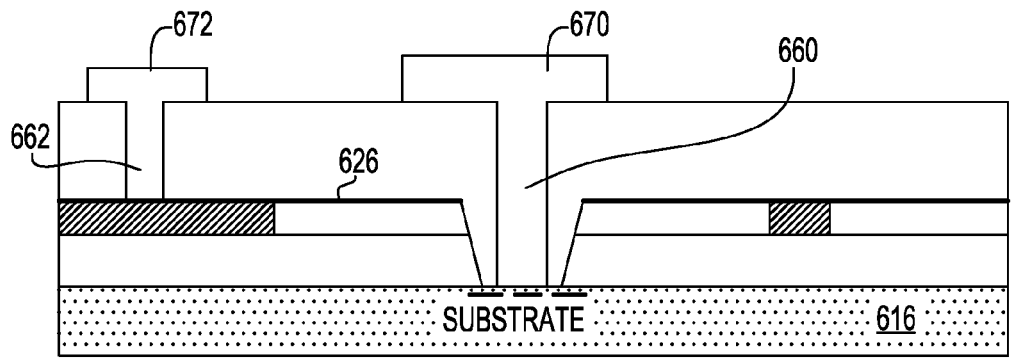

Additional variations of the embodiments shown in FIGS. 7 through 13 or FIGS. 16 through 17 can also be provided. As shown in FIG. 19, a contact hole 610 is formed which extends through a conformal layer 626, a trench isolation region 624 and a BOX layer 618 underlying the trench isolation region 624. A portion 620 of the bulk silicon region 616 is exposed within the contact hole 610. An opening is formed in a photoresist layer 650 overlying the conformal layer 626, after which an ion implant process is performed to implant the exposed portion 620 of the bulk semiconductor region, such that the dopant concentration therein is altered, e.g., increased. Thereafter, as illustrated in FIG. 20, the photoresist layer is removed and an ILD layer 614 is formed to overlie the structure. FIG. 21 illustrates a later stage of fabrication after conductive vias are formed, or a guard ring 660 contacting the bulk substrate region 616 and a conductive device contact via 662 are formed. Horizontal conductors 670, 672 connected to the conductive vias are disposed above the ILD layer 614.

Figure 22A:
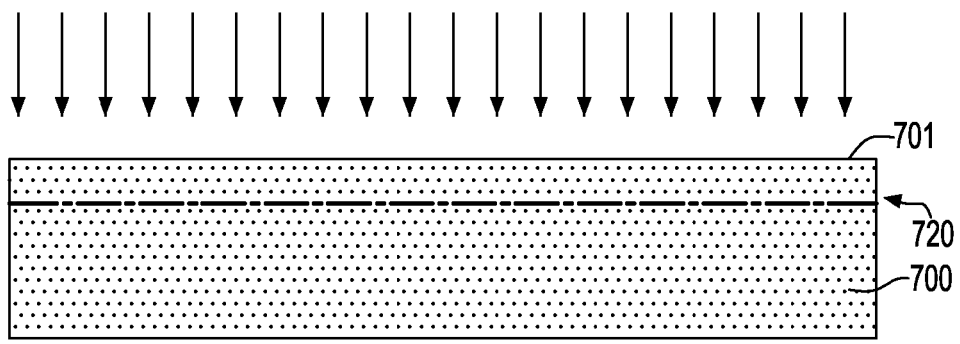
FIGS. 22A through 26 are sectional views illustrating stages in a method of fabricating a microelectronic structure in accordance with an embodiment of the invention.
Figure 22B:
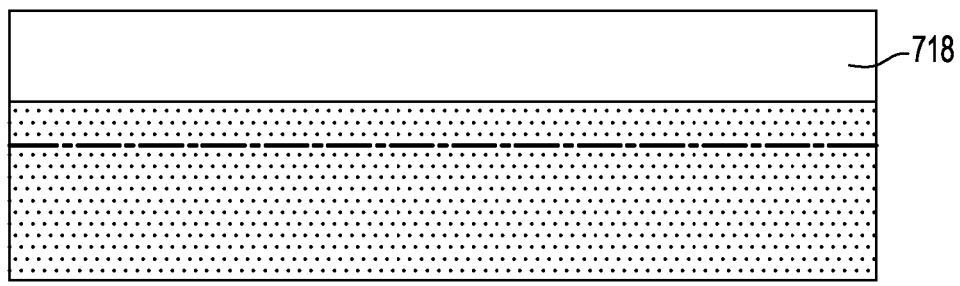
Figure 23:
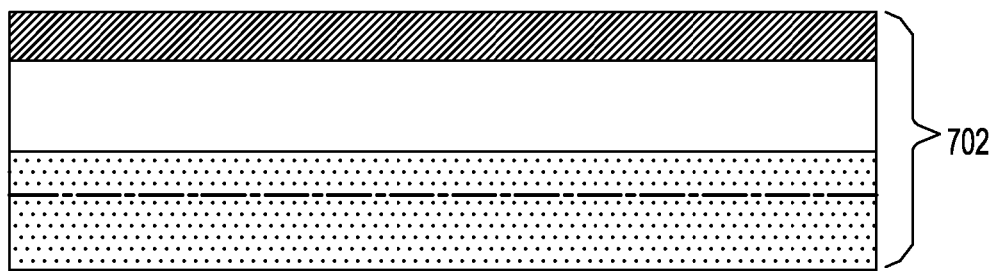
Figure 24:
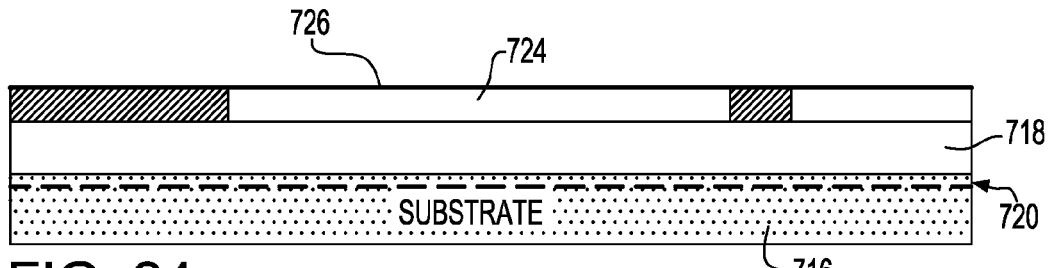

In another variation, the process of making an SOI wafer is varied. A blanket ion implant is performed to establish a doped region 720 below a surface 701 of a handle wafer 700 (FIG. 22A). After forming an oxide layer 718 thereon (FIG. 22B), the handle wafer is then bonded to a bond wafer and processed, e.g., ground down or cut (such as by the so-called SMART cut process) to form an SOI wafer 702 (FIG. 23). The trench isolation region 724 and the conformal layer 726 are then formed, resulting in the structure as shown in FIG. 24. In this way, an SOI substrate is provided in which a relatively shallow region 720 of the underlying bulk silicon region 716 has a desirably high dopant concentration, e.g., a high boron concentration (e.g., a concentration greater than about $1.0 \times 10^{17}$ cm$^{-3}$, desirably greater than $10^{19}$ cm$^{-3}$) near the BOX layer, the doped shallow region extending over a large area. Alignment between the doped region 720 and the opening in the trench isolation region 724 and the conformal nitride layer 726 are then assured.

Figure 25:
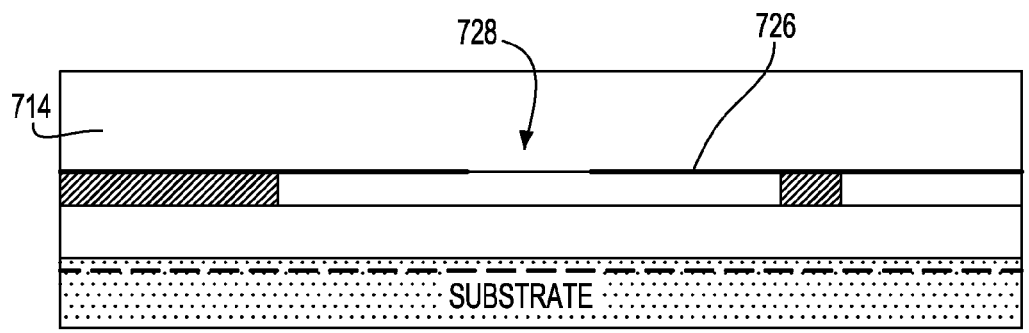
Figure 26:
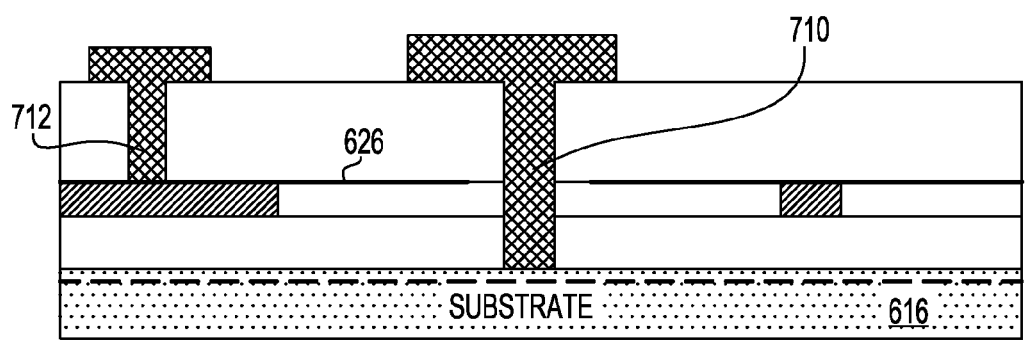

Referring to FIG. 25, thereafter, an opening 728 is formed in the conformal layer 726, and the ILD layer 714 is formed. FIG. 26 illustrates the structure after a substrate conductive contact via 710 and a device contact via 712 are formed.

Figure 27:
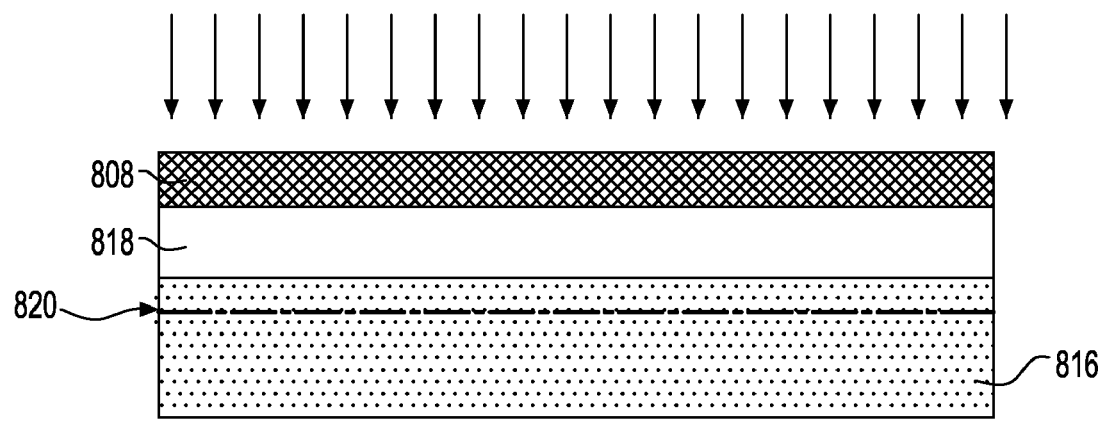
FIG. 27 is a sectional view illustrating a stage in a method of fabricating a microelectronic structure in accordance with an embodiment of the invention.

FIG. 27 illustrates a variation of the embodiment shown and described above with respect to FIGS. 22A through 26. Here, in a preliminary stage of fabrication, an ion implant is performed into a fully formed SOI substrate which as yet lacks the implanted region 820. In this case, the energy level and dose of the implant are set sufficiently high to implant the bulk silicon region 816 through the SOI layer 808 and BOX layer 818.

Figure 28:
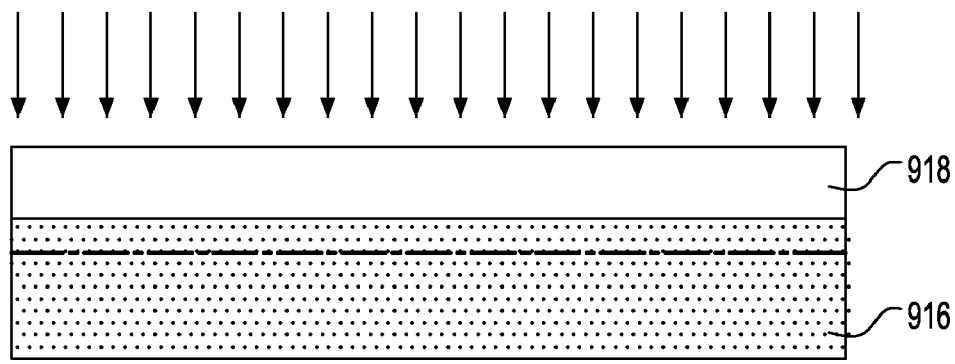
FIGS. 28 and 29 are sectional views illustrating stages in a method of fabricating a microelectronic structure in accordance with an embodiment of the invention.
Figure 29:
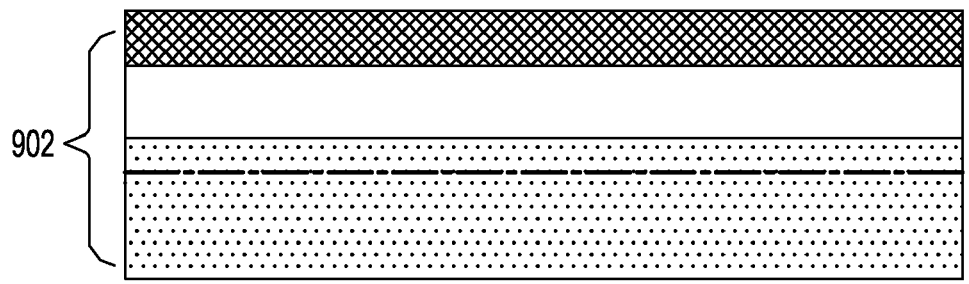

In the variation shown in FIG. 28, the ion implant is performed into the bulk silicon region 916 of a handle wafer through an oxide layer 918, after which the handle wafer is bonded to a bond wafer and processed to form the SOI wafer 902 (FIG. 29).

In still another variation (not shown), the SOI wafer 902 having a structure as shown in FIG. 29 can be formed by ion implanting a silicon substrate with the desired dopant (e.g., boron) to the desired depth to form the implanted region in the bulk semiconductor region. This process can be conducted, either before or after a BOX layer of the SOI wafer 902 is formed by implantation, e.g., such as by a process referred to as "SIMOX" ("Silicon IMplantation of Oxide").

Figure 30:
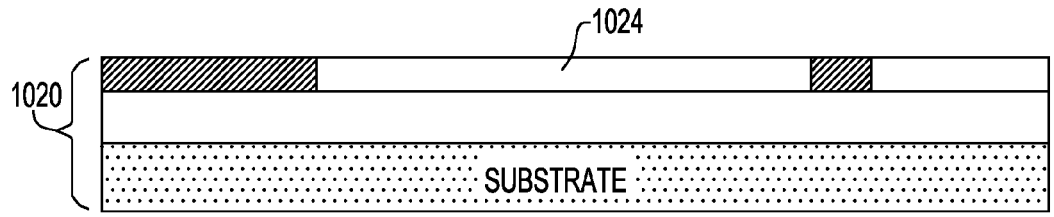
FIGS. 30 and 31 are sectional views illustrating stages in a method of fabricating a microelectronic structure in accordance with an embodiment of the invention.
Figure 31:
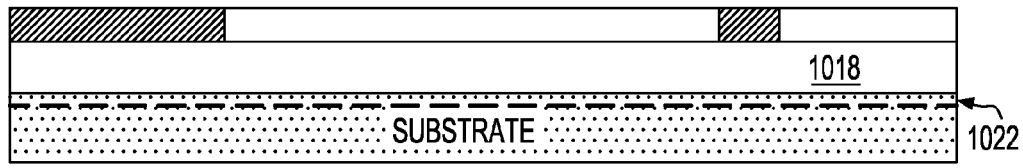
Figure 32:
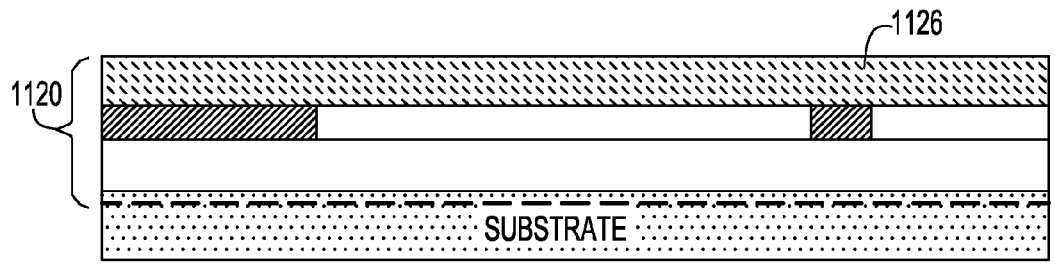
FIGS. 32 through 36 are sectional views illustrating stages in a method of fabricating a microelectronic structure in accordance with an embodiment of the invention.
Figure 33:
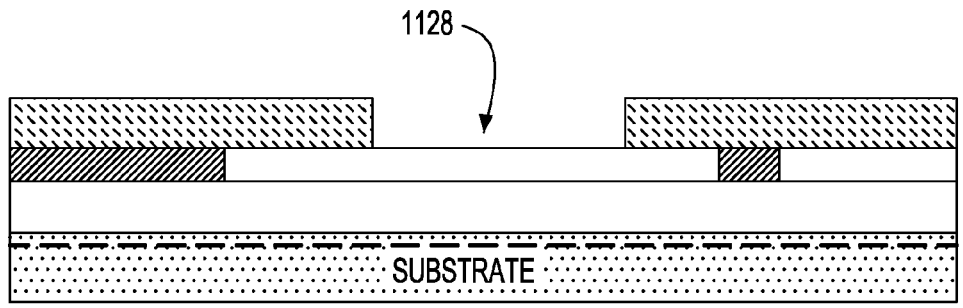
Figure 34:
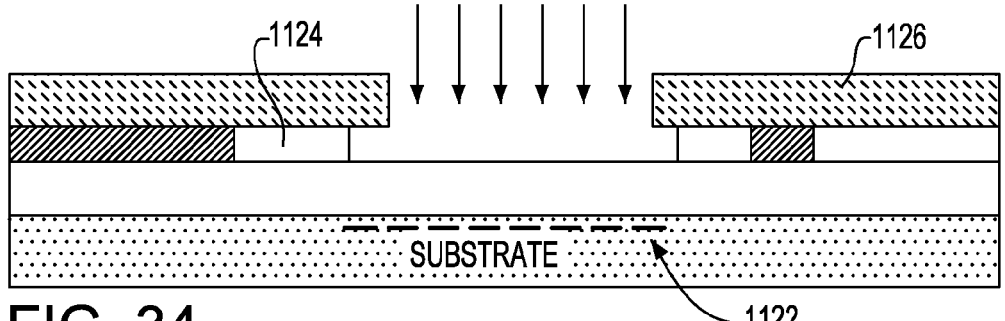
Figure 35:
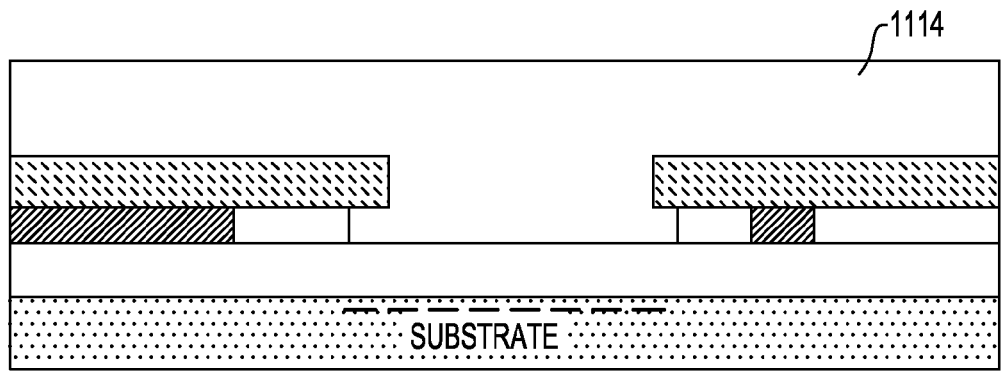

FIGS. 30 and 31 illustrate a further variation in which an SOI substrate 1020 having the trench isolation region 1024 (FIG. 30) therein is implanted with an ion to form the implanted region 1022 (FIG. 31) underlying the BOX layer 1018.

In another variation shown in FIGS. 32 through 36, an SOI substrate 1120 having a conformal layer 1126 thereon (FIG. 32) is patterned to form an opening 1128 (FIG. 33) in the conformal layer. A portion of the trench isolation region 1124 (FIG. 34) then is patterned, i.e., recessed or removed, in accordance with the opening in the conformal layer 1126. Thereafter, an ion implant process is performed to implant an ion into the bulk silicon region to form an implanted region 1122.

Figure 36:
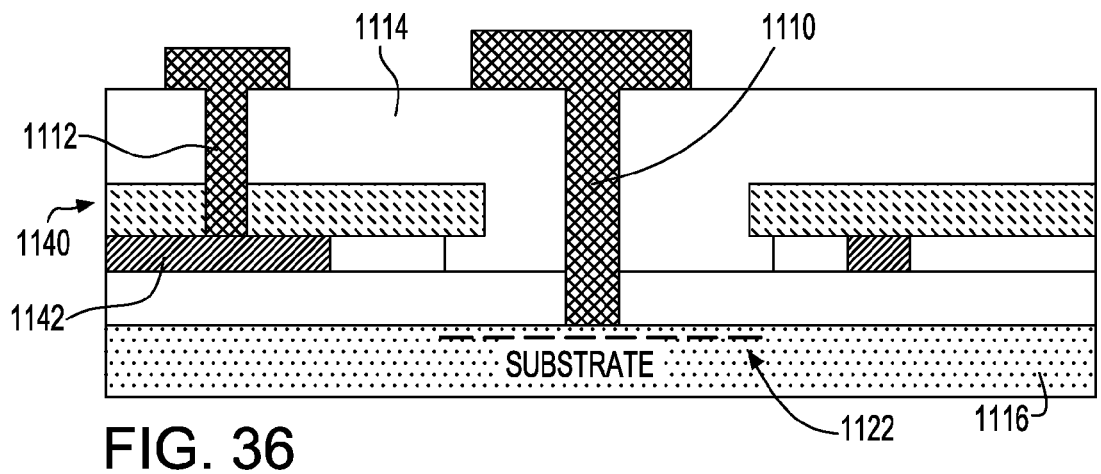

An ILD layer 1114 (FIG. 35) then is formed, after which a substrate contact via or guard ring 1110 (FIG. 36) is formed in contact with the implanted region 1122 and a device contact 1112 is formed in contact with an active semiconductor region 1142 belonging to a microelectronic device 1140 (shown partially in FIG. 36). In a particular embodiment, the bulk semiconductor region 1116 is doped n-type, e.g., with a dopant such as arsenic or phosphorus, and the implanted region 1122 is doped with an n-type dopant or with a p-type dopant.

While the invention has been described in accordance with certain preferred embodiments thereof, many modifications and enhancements can be made thereto without departing from the true scope and spirit of the invention, which is limited only by the claims appended below.

What is claimed is:

1. A method of forming a conductive via contacting a bulk semiconductor region of a semiconductor-on-insulator ("SOI") substrate, the bulk semiconductor region being separated from a SOI layer of the substrate by a buried dielectric layer, the method comprising:
   a) forming a first opening in a conformal layer overlying a trench isolation region, the trench isolation region sharing an edge with the SOI layer and the conformal layer containing either compressive or tensile stress;
   b) depositing a dielectric layer atop the conformal layer and the trench isolation region;
   c) forming a second opening aligned with the first opening, the second opening extending through the dielectric layer and exposing the bulk semiconductor region; and
   d) forming the conductive via in the second opening.

2. A method of forming a conductive via as claimed in claim 1, wherein the conformal layer includes a stressed nitride liner and the stressed nitride liner applies a stress to a transistor channel region disposed in the SOI layer.

3. A method of forming a conductive via as claimed in claim 1, wherein the conformal layer includes a first stressed nitride liner and a second stressed nitride liner, the first stressed nitride liner applying a first stress to a channel region of at least one first transistor provided in the SOI layer, and the second stressed nitride liner applying a second stress to a channel region of at least one second transistor provided in the SOI layer.

4. A method of forming a conductive via as claimed in claim 1, further comprising, simultaneously when forming the second opening, forming a third opening extending through the dielectric layer and the conformal layer to expose a portion of a transistor and, simultaneously when forming the conductive via in the second opening, forming a second conductive via in the third opening.

5. A method of forming a conductive via as claimed in claim 1, further comprising implanting a dopant into the bulk semiconductor region to form an implanted region, wherein the first opening is formed in alignment with the implanted region.

6. A method of forming a conductive via as claimed in claim 1, further comprising forming the conformal layer, wherein the dopant is implanted into the bulk semiconductor region before the conformal layer is formed.

7. A method of forming a conductive via as claimed in claim 1, further comprising, prior to step (c), forming a third opening extending at least partially through the trench isolation region and implanting an ion into the bulk semiconductor region through the third opening.

8. A method of forming a conductive via as claimed in claim 7, further comprising forming a masking layer over the conformal layer prior to implanting the ion.

9. A method of forming a conductive via contacting a bulk semiconductor region of a semiconductor-on-insulator ("SOI") substrate, the bulk semiconductor region being separated from a SOI layer of the substrate by a buried dielectric layer, the method comprising:
   a) forming a first opening in a first conformal layer overlying a trench isolation region, the trench isolation region sharing an edge with the SOI layer;
   b) depositing a second conformal layer overlying the first opening;
   c) removing the second conformal layer from the first opening to expose the trench isolation region;
   d) depositing a dielectric layer atop the conformal layers and the trench isolation region;
   e) forming a second opening aligned with the first opening, the second opening extending through the dielectric layer and exposing the bulk semiconductor region; and
   f) forming the conductive via in the second opening.

10. A method of forming a conductive via as claimed in claim 9, further comprising forming a first transistor and a second transistor prior to said steps (a) through (c), wherein the first conformal layer lies atop the first transistor and has a first stress being one of tensile stress and compressive stress, and the second conformal layer lies atop the second transistor and has a second stress being one of tensile stress and compressive stress other than the first stress.

11. A method of forming a conductive via as claimed in claim 9, further comprising simultaneously with step (c), forming a third opening in the dielectric layer and the conformal layer aligned with at least one of a transistor source region disposed in the SOI layer or a transistor drain region disposed in the SOI layer, and prior to step (d), implanting an ion through the second opening into the bulk semiconductor region at an angle other than a normal angle relative to a major surface of the bulk semiconductor region.

12. A method of forming a conductive via as claimed in claim 11, wherein during the step of implanting the ion, an aspect ratio of the third opening avoids the ion from being implanted into the at least one of the transistor source region or the transistor drain region.

13. A method of forming a conductive via contacting a bulk semiconductor region of a semiconductor-on-insulator ("SOI") substrate, the bulk semiconductor region being separated from a SOI layer of the substrate by a buried dielectric layer, the method comprising:
   a) forming a first opening in a conformal layer overlying a trench isolation region, the trench isolation region sharing an edge with the SOI layer;
   b) using the conformal layer as a masking layer, extending the first opening through the trench isolation region and the buried dielectric layer to expose the bulk semiconductor region;

c) depositing a dielectric layer to fill the first opening;

d) forming a second opening aligned with the first opening, the second opening extending through the dielectric layer to expose the bulk semiconductor region; and e) forming the conductive via in the second opening.

14. A method of forming a conductive via as claimed in claim 13, further comprising forming a low-resistance layer including a silicide atop the exposed bulk semiconductor region within the first opening prior to step (c).

15. A method of forming a conductive via as claimed in claim 14, further comprising, simultaneously when forming the second opening, forming a third opening extending through the dielectric layer and the conformal layer to expose a semiconductor region of a transistor and, simultaneously with step (e), forming a second conductive via in the third opening.

* * * * *